(12) United States Patent
Herbsommer et al.

(10) Patent No.: US 10,539,630 B2
(45) Date of Patent: Jan. 21, 2020

(54) PACKAGE FOR CHIP SCALE MAGNETOMETER OR ATOMIC CLOCK

(71) Applicant: Texas Instruments Incorporated, Dallas, TX (US)

(72) Inventors: Juan Herbsommer, Allen, TX (US); Benjamin Cook, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 86 days.

(21) Appl. No.: 15/367,638

(22) Filed: Dec. 2, 2016

(65) Prior Publication Data
US 2018/0156875 A1    Jun. 7, 2018

(51) Int. Cl.
G01R 33/032    (2006.01)
G04F 5/14    (2006.01)
H03B 17/00    (2006.01)

(52) U.S. Cl.
CPC ............ G01R 33/032 (2013.01); G04F 5/14 (2013.01); H03B 17/00 (2013.01)

(58) Field of Classification Search
CPC ......... G01R 33/032; G04F 5/14; G04F 5/145; H03B 17/00; H03L 7/26
USPC .................................. 331/3, 94.1
See application file for complete search history.

(56) References Cited

U.S. PATENT DOCUMENTS

| | | | | |
|---|---|---|---|---|
| 7,521,928 B2 * | 4/2009 | Romalis | ................ | G01R 33/24 324/301 |
| 7,619,485 B2 | 11/2009 | DeNatale et al. | | |
| 7,826,065 B1 * | 11/2010 | Okandan | ................ | G01B 11/02 324/244.1 |
| 8,212,556 B1 * | 7/2012 | Schwindt | ................ | G01R 33/26 324/301 |
| 8,373,413 B2 * | 2/2013 | Sugioka | ................ | G01R 33/26 324/304 |
| 9,964,610 B2 * | 5/2018 | Shah | ................ | G01R 33/26 |
| 9,995,800 B1 * | 6/2018 | Schwindt | ................ | G01R 33/26 |
| 2006/0022761 A1 | 2/2006 | Abeles et al. | | |
| 2009/0039881 A1 | 2/2009 | Kitching et al. | | |
| 2009/0243610 A1 * | 10/2009 | Ichihara | ................ | B82Y 25/00 324/301 |

(Continued)

FOREIGN PATENT DOCUMENTS

WO    2015108439    7/2015

OTHER PUBLICATIONS

International Search Report for PCT Application No. PCT/US2017/064488 dated Mar. 15, 2018 (2 pages).

*Primary Examiner* — Levi Gannon
(74) *Attorney, Agent, or Firm* — Michael A. Davis, Jr.; Charles A. Brill; Frank D. Cimino

(57) ABSTRACT

A package for a chip scale atomic clock or magnetometer is disclosed. The package includes a vapor cell using an alkali metal vapor, first and second photodetectors, and a laser operable at a frequency that excites an electron transition in the alkali metal vapor. The laser is positioned to provide an optical signal directed through the vapor cell and towards the first photodetector. The package further contains a polarizing beam splitter, the polarizing beam splitter positioned between the vapor cell and the first photodetector to receive the optical signal and to split the optical signal into a first signal directed toward the first photodetector and a second signal directed toward the second photodetector, the first signal being orthogonal to the second signal.

11 Claims, 5 Drawing Sheets

(56) References Cited

U.S. PATENT DOCUMENTS

| | | | | |
|---|---|---|---|---|
| 2012/0062221 A1* | 3/2012 | Le Prado | ............... | G01C 19/62 |
| | | | | 324/244 |
| 2013/0278253 A1* | 10/2013 | Ichihara | ................ | G01R 33/26 |
| | | | | 324/304 |
| 2014/0232478 A1* | 8/2014 | Maki | ...................... | H03B 17/00 |
| | | | | 331/94.1 |
| 2015/0377989 A1* | 12/2015 | Ben Amar Baranga | ...................... | |
| | | | | G01R 33/26 |
| | | | | 324/304 |
| 2016/0097824 A1* | 4/2016 | Fujii | .................... | G01R 33/032 |
| | | | | 324/244.1 |
| 2016/0116553 A1* | 4/2016 | Kim | .................... | G01R 33/032 |
| | | | | 324/305 |

* cited by examiner

PACKAGE FOR CHIP SCALE MAGNETOMETER OR ATOMIC CLOCK

FIELD OF THE DISCLOSURE

Disclosed embodiments relate generally to the field of packaging semiconductor chips. More particularly, and not by way of any limitation, the present disclosure is directed to a package for a magnetometer or atomic clock.

BACKGROUND

Chip-Scale Atomic Clocks (CSACs) and magnetometers both utilize vapor cells that enclose vapors of alkali metals—typically either rubidium (Rb) or cesium (Cs). A laser sends a signal at an optical wavelength through the vapor cell, exciting hyperfine transitions using a phenomenon called coherent population trapping (CPT). A cesium-based CSAC, for example, may use a laser that is tuned to the D1 absorption line of cesium at 894 nm. The laser sweeps a frequency region around the absorption line and monitors, at a photodetector, the amount of the light that is absorbed in passing through the vapor cell. The region of maximum absorption is detected and used to stabilize a reference frequency that is provided by the CSAC or magnetometer. The intrinsic noise in the system can hamper attempts to increase sensitivity in the measurements.

CSACs and magnetometers utilize similar structures, with one exception. With no external magnetic field, the Zeeman levels of an electronic transition are degenerate. However, in the presence of an external magnetic field, the degeneracy is broken, and the Zeeman levels are split in energy by the gyrometric ratio and the quantum number of degeneracy $mf=0, +/-1, \ldots +/-n$. Structurally, this means that when the vapor cell is used for a CSAC, magnetic shielding is provided around the package to eliminate the external field and allow for a bias to provide a fixed splitting of the Zeeman levels; however, a magnetometer uses the spacing of the split absorption lines to measure the intensity of the magnetic field. Accordingly, different packages need to be produced to satisfy the needs of these different uses. Improvements to the fabrication and stability of these devices are desirable.

SUMMARY

Disclosed embodiments implement a package for a CSAC or magnetometer that reduces noise by using orthogonal signals. After the optical beam has traversed the vapor cell, a polarizing beam splitter splits the optical signal into two orthogonal signals. The two orthogonal signals, when processed by different photodetectors, provide differential signals that cancel noise when processed and increase sensitivity. Sets of coils, e.g. Helmholtz coils, can be arranged to surround sensitive portions of the package and coupled to contacts that can be used to energize the coils as electromagnets. With the addition of differential signals and the ability to selectively block a magnetic field, a single package can be utilized as a CSAC, a zero field magnetometer or a free induction decay magnetometer. With appropriate control circuitry, the disclosed package can cycle between the different uses.

In one aspect, an embodiment of a package for a chip scale atomic clock or magnetometer is disclosed. The package includes a vapor cell comprising an alkali metal vapor; first and second photodetectors; a laser operable at a frequency that excites an electron transition in the alkali metal vapor, the laser positioned to provide an optical signal directed through the vapor cell and towards the first photodetector; and a polarizing beam splitter, the polarizing beam splitter positioned between the vapor cell and the first photodetector to receive the optical signal and to split the optical signal into a first signal directed toward the first photodetector and a second signal directed toward the second photodetector, the first signal being orthogonal to the second signal.

In another aspect, an embodiment of a package for a chip scale atomic clock or magnetometer is disclosed. The package includes a vapor cell comprising an alkali metal vapor; a first photodetector; a laser operable at a frequency that excites an electron transition in the alkali metal vapor, the laser positioned to direct an optical signal through the vapor cell and towards the first photodetector; and first, second and third sets of conductive coils coupled to contact pads for a power source, the first, second and third sets of conductive coils arranged to magnetically isolate the vapor cell when powered.

In yet another aspect, a package for operation as both a chip scale atomic clock and a magnetometer is disclosed. The package includes a vapor cell comprising an alkali metal vapor; first and second photodetectors; a laser operable at a frequency that excites an electron transition in the alkali metal vapor, the laser positioned to provide an optical signal directed through the vapor cell and towards the first photodetector; a polarizing beam splitter, the polarizing beam splitter positioned between the vapor cell and the first photodetector to receive the optical signal and to split the optical signal into a first signal directed toward the first photodetector and a second signal directed toward the second photodetector, the first signal being orthogonal to the second signal; and first, second and third sets of conductive coils coupled to contact pads for a power source, the first, second and third sets of conductive coils arranged to magnetically isolate the vapor cell when powered.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 3:
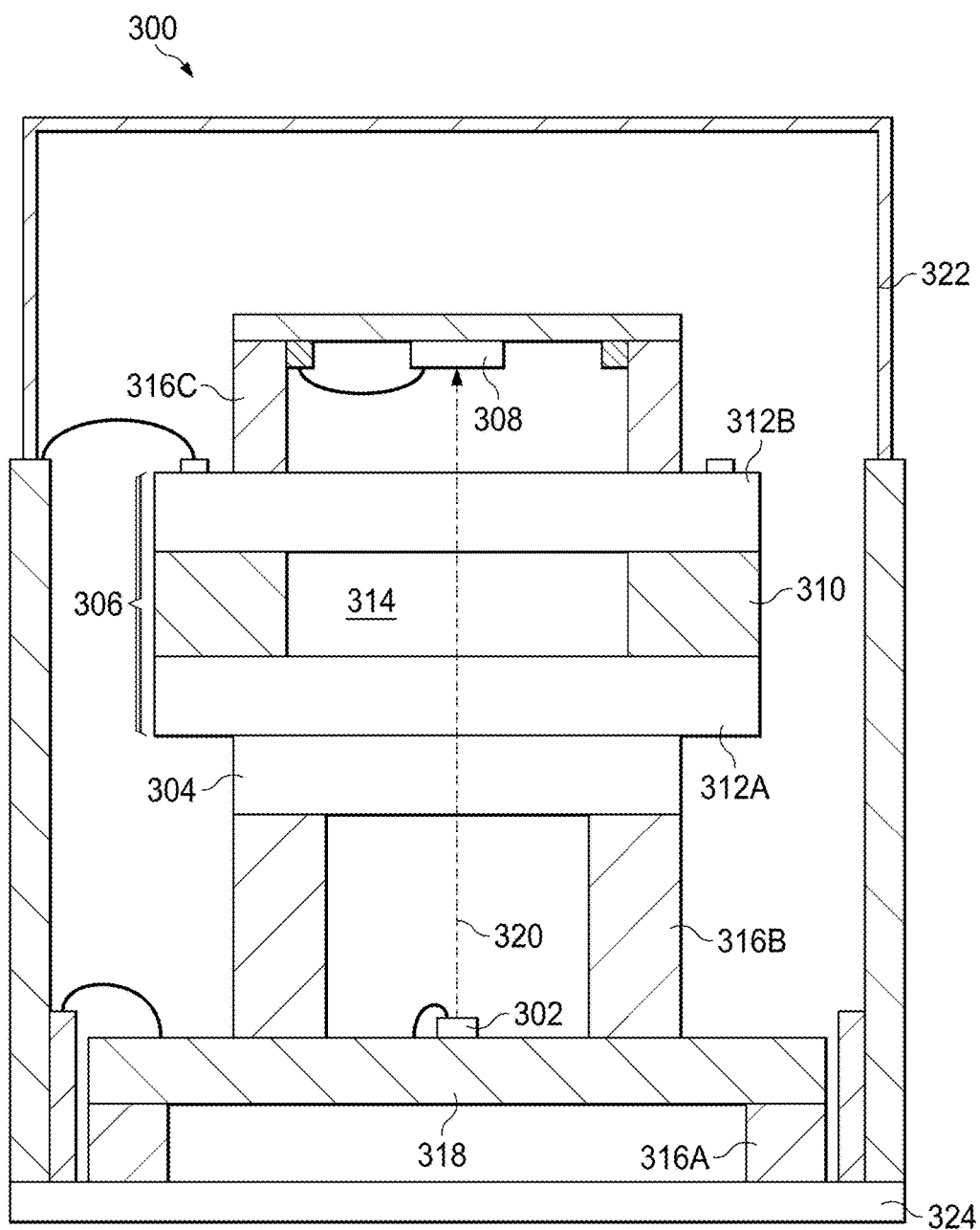
FIG. 3 depicts an example of a package for a CSAC or magnetometer according to the prior art.

Turning first to FIG. 3, a block diagram of a package 300 for a CSAC or magnetometer is shown according to the prior art. Package 300 includes a laser 302, a vapor cell 306 that encloses an alkali metal vapor and a photodetector 308. Laser 302 can be a vertical-cavity surface-emitting laser (VCSEL) that is arranged to send an optical beam 320 at a predetermined frequency through vapor cell 306 and to provide the optical beam 320 to photodetector 308. In one example, a vapor cell 306 contains $Cs^{133}$, while laser 302 is tuned to 894 nm. An optics package 304 can be placed between laser 302 and vapor cell 306 to provide appropriate processing of the optical beam 320. Optics package 304 can include a polarizer, a quarter-wave plate, a lens or any combination of these elements according to the specific design. Vapor cell 306 can be formed, for example, of three separate substrates 312A, 310, 312B bonded together. Substrate 310 can be silicon, glass, metal, ceramic or other material, through which a cavity 314 has been etched. Substrates 312A, 312B can be formed of glass that allows laser beam 320 to pass through largely un-attenuated.

At the time the three substrates 312A, 310, 312B are bonded to each other, an alkali metal or metal vapor, e.g., cesium or rubidium, is introduced into cavity 314. The metal vapor captured in vapor cell 306 will absorb some of optical beam 320 when laser 302 is operated at a specific, known frequency. The intensity of optical beam 320 is monitored at photodetector 308 while laser 302 sweeps across a frequency range that includes a selected absorption line of the alkali metal vapor. The frequency at which the maximum absorption occurs can be used to provide a clock reference signal that is highly stable.

In order to provide a more stable laser 302, a heater 318 can be coupled to provide thermal stability to laser 302. Various standoffs 316 are provided as shown and are used to separate components into different levels. For example, one set of standoffs 316A holds heater 318 away from ground plane 324 to slow thermal bleed-off. A second set of standoffs 316B places the optics package 304 at a distance for appropriate focus of laser 302 and standoffs 316C provide spacing between photodetector 308 and vapor cell 306. External packaging 322 is provided to protect the various dies. When package 300 is used for providing an atomic clock, the external packaging 322 may include a material that serves to shield the package 300 from magnetic fields, e.g. an iron alloy. When package 300 is fabricated for a magnetometer, magnetic shielding is not necessary. In this instance, the external packaging 322 may be plastic, ceramic or other suitable encapsulation material.

Figure 4:
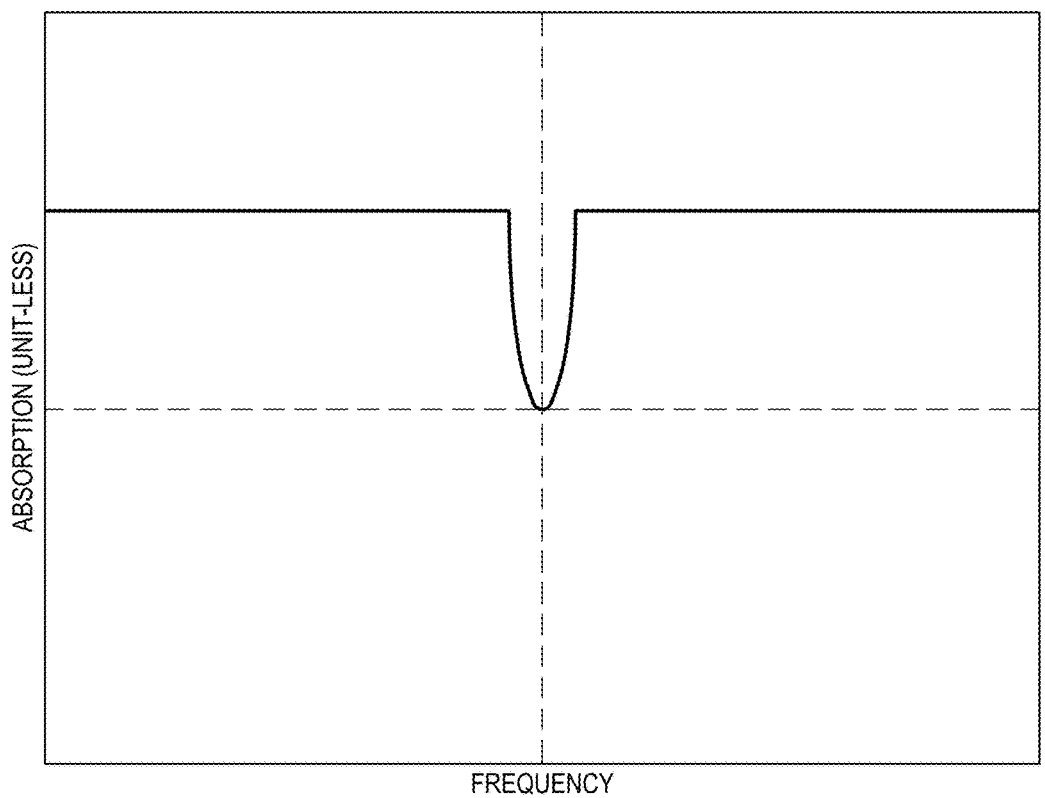
FIG. 4 depicts a typical absorption line, e.g., of cesium at 852 nm.
Figure 5:
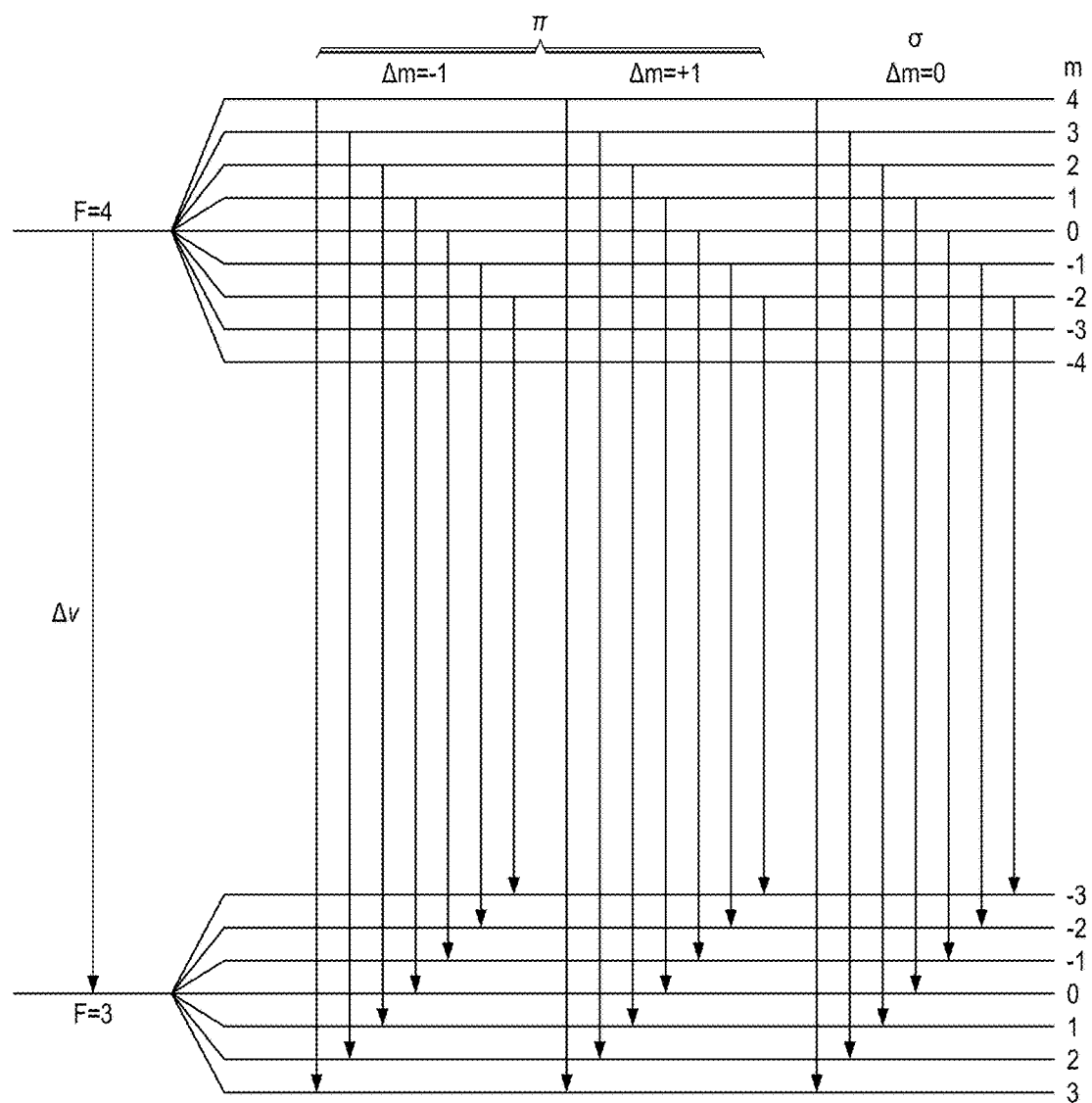
FIG. 5 depicts the hyperfine-structure energy levels of $Cs^{133}$ in a weak magnetic field.

FIG. 4 is a graph depicting an absorption line of light by an alkali metal, such as cesium vapor, at various wavelengths and depicts the drop in transmitted light at specific wavelengths, one of which for cesium occurs at a wavelength of 894 nm. An interesting phenomenon occurs to this absorption line in the presence of a magnetic field, such as the earth's magnetic field, and is depicted in FIG. 5. Instead of providing a single absorption line, as shown in FIG. 4, the absorption line is split into three to seven equally spaced lines representing hyperfine-structure energy levels of the alkali metal, the Zeeman levels. The number of lines is related to the alkali metal, while the spacing between the lines is proportional to the strength of the magnetic field.

One issue that can arise in a package for an atomic clock or magnetometer is the variability of the laser over time. Even with the use of a heater to stabilize the transmissions from the laser, the frequency of light in a chip scale package can vary. This variation can introduce a "wiggle" or fluctuation in the frequency transmitted and thus will introduce a corresponding fluctuation in the signal received at the photodetector.

Figure 1:
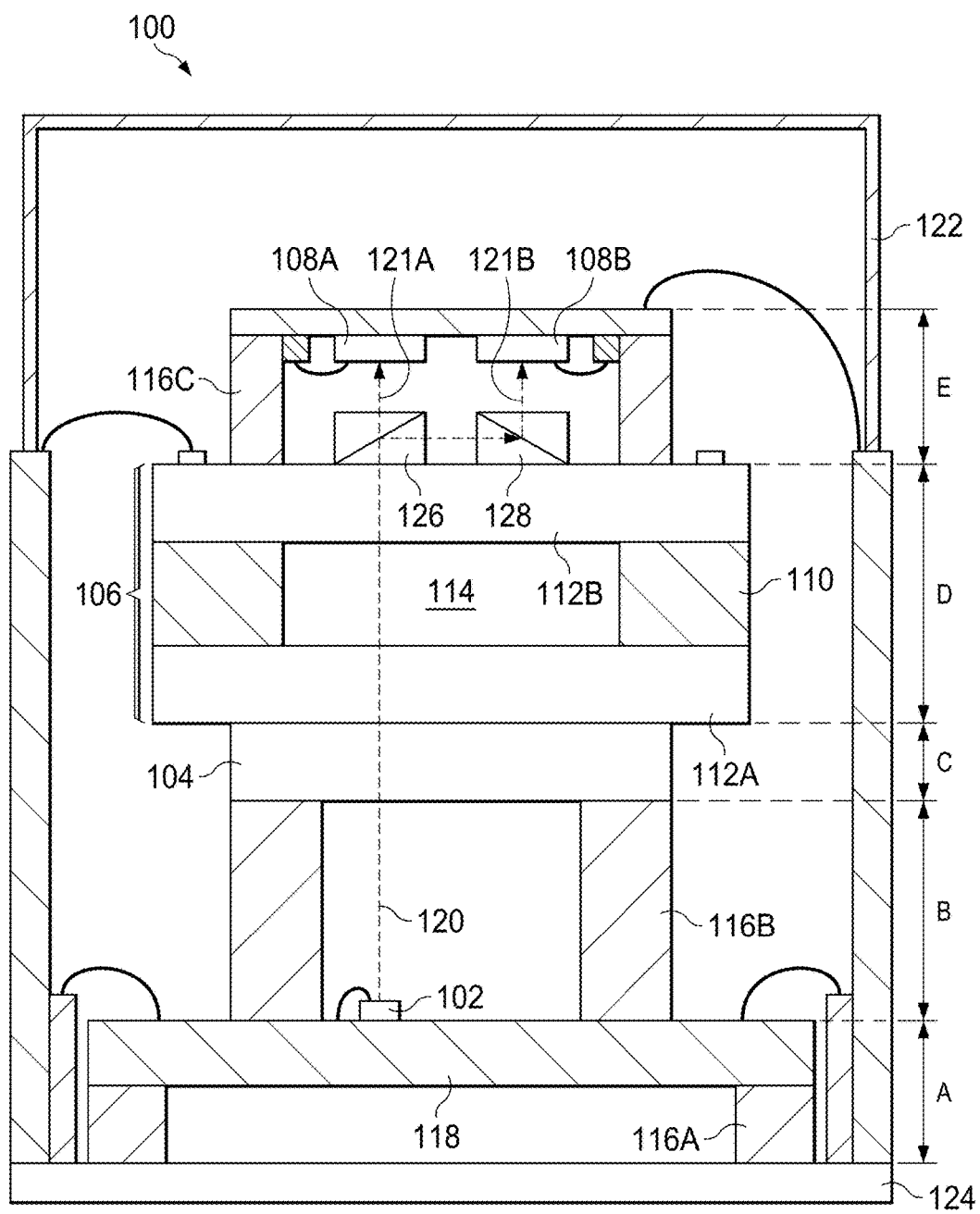
FIG. 1 depicts an example of a package for a CSAC/magnetometer according to an embodiment of the disclosure.

Referring now to FIG. 1, a package 100 for a chip scale atomic clock or magnetometer is disclosed according to an embodiment of the disclosure. Package 100 contains laser 102, vapor cell 106, two photodetectors 108A, 108B and a polarizing beam splitter 126. Laser 102 directs optical beam 120 through vapor cell 106 and towards polarizing beam splitter 126. Polarizing beam splitter 126 splits optical beam 120 into two orthogonal beams 121A, 121B that are directed towards photodetectors 108A and 108B respectively. In the embodiment shown in package 100, beam 121A continues along the path of optical beam 120 and is received at photodetector 108A, while beam 121B is directed to reflector 128, which reflects beam 121B to photodetector 108B. In one embodiment, reflector 128 can be a second polarizing beam splitter that reflects beam 121B towards photodetector 108B. In one embodiment, reflector 128 can be a mirror that reflects the beam 121B towards photodetector 108B. Other positions of one or both of photodetectors 108A, 108B can also be used. In one embodiment, shown in FIG. 2, reflector 128 is not used and photodetector 108B is positioned on spacer 116C such that as beam 121B exits polarizing beam splitter 126, beam 121B is directed to photodetector 108B. The use of orthogonal signals, both carrying information from vapor cell 106, operates to provide the same cancellation of noise as using differential electrical signals, decreasing the fluctuations caused by the variations in the laser signal, smoothing the received signal and providing a larger signal-to-noise ratio for the package.

In addition to the components mentioned above, package 100 may also contain heater 118, optical package 104, ground plate 124, encapsulation structure 122 and standoffs 116A, 116B, 116C, which perform the same functions as their counterparts in FIG. 3 and are not further explained herein. Vapor package 106 includes a hermetic cavity 114 that is formed in substrate 110 and sealed between substrates 112A, 112B, which may be glass. Circuitry to control laser 102 and heater 118 and to process the data collected by photodetectors 108 is generally provided on a separate chip (not specifically shown), to which chip 100 can be mounted.

In the embodiment shown in FIG. 1, package 100 includes five sections, here labeled A-E. In one embodiment, level A has the largest horizontal dimensions and occupies a region approximately 12×12 mm. Including offset 116A, which provides a thermal offset for heater 118 from ground plate 124, stage A has a height of approximately 1.2 mm. Offsets 116B form level B and are 3.3 mm high. Level C is the optics package 104, which occupies a space 8×8 mm and is 0.8 mm high; offsets 116B also occupy a space of 8×8 mm to provide support for optical package 104. Level D is occupied by vapor cell 106, which in this embodiment is 2.5 mm high and occupies a horizontal space of 10×10 mm. Level E forms the uppermost level of package 100 and includes photodetectors 108, polarizing beam splitter 126 and reflector 128; level E occupies a horizontal space of 7×7 mm and is approximately 1.5 mm tall.

Figure 2:
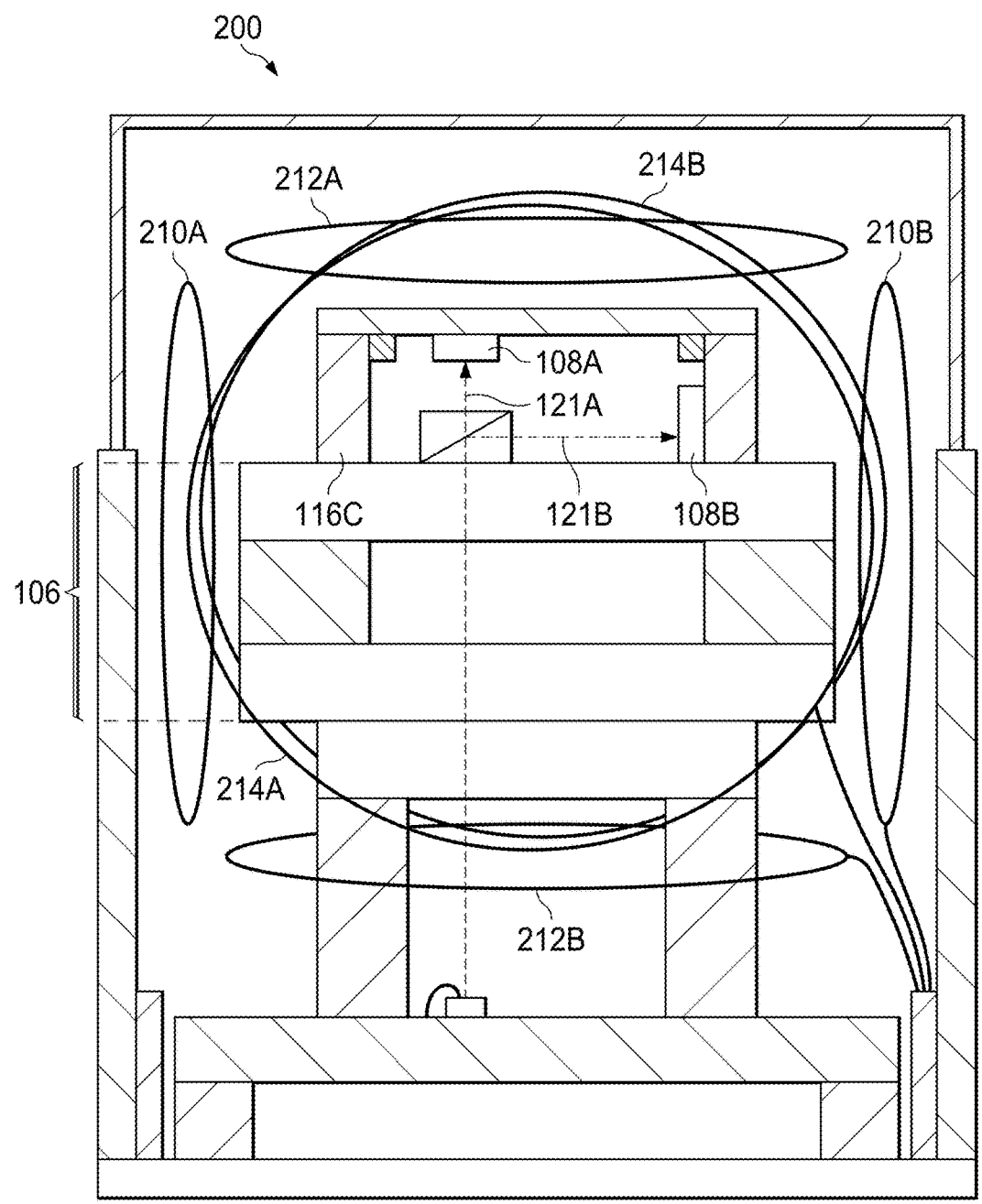
FIG. 2 depicts an example of a package for a CSAC/magnetometer according to an embodiment of the disclosure.

As mentioned previously, the components shown in FIG. 1 can be utilized for either an atomic clock or a magnetometer. When used for an atomic clock, magnetic shielding must be provided to prevent earth's magnetic field, or any other magnetic field, from affecting the operation of the clock. FIG. 2 discloses a package 200 according to an embodiment of the disclosure that can obviate the need for separate packaging for the different applications of package 200. Package 200 has been simplified slightly from package 100, primarily by not showing the previous wiring connections, and discloses an alternate arrangement of photodetectors 108A, 108B. Additionally, package 200 contains three sets of coils 210, 212, 214 that surround vapor cell 106. As seen in package 200, coil 210A is arranged to the left of the vapor cell 106 and coil 210B is arranged to the right of the vapor cell 106. Similarly coil 212A is arranged above vapor cell 106 and coil 212B is arranged below vapor cell 106, while coil 214A is arranged in front of vapor cell 106 and coil 214B is arranged behind vapor cell 106, so that the vapor cell 106 is magnetically isolated in three dimensions. Each set of coils 210, 212, 214 may be, for example, solenoids or Helmholtz coils, and are coupled to one or more contacts (not specifically shown) that can be used to power the coils as electromagnetics. When the package 200 is to be used as a magnetometer, the power source does not need to be connected to coils 210, 212, 214; however when package 200 is to be used as an atomic clock, the coils 210, 212, 214 are coupled to a power source and energized as electromagnets that cancel any external magnetic fields.

Although not specifically shown, coils surrounding the vapor cell and operable as electromagnets can also be utilized in older packages, such as shown in FIG. 3, to allow the packages to operate as either a magnetometer or an atomic clock. In at least one embodiment, package 200 can be mounted with external circuitry that allows the package to be used alternately as an atomic clock and as a magnetometer. In this embodiment, package 200 can be operated as a magnetometer, i.e., without energizing the coils. Once the magnetic field is measured, the coils can be energized to cancel the detected magnetic field and the package can be operated as an atomic clock. In one embodiment, the atomic clock can be used to discipline a lower stability clock that operates continuously. A cycle from magnetometer to atomic clock and back to magnetometer can be repeated as quickly as necessary or desired. It can be noted that if the magnetic field is changing very quickly over time, the cycle time can be adjusted to account for the changing of the magnetic field.

Improvements to the packaging of a CSAC or magnetometer have been shown. Orthogonal signals carrying the information gained from a laser passed through an alkali vapor cell have been provided by splitting an optical beam using a polarizing beam splitter. The orthogonal signals are processed by separate photodetectors and used to provide cancellation of noise in the signal. Magnetic shielding can be provided by sets of coils that are arranged to surround the vapor cell and are coupled to contacts for a power supply. When the coils are powered, magnetic shielding is provided and the package can be used as a chip scale atomic clock. When the coils are unpowered, no magnetic shielding is provided and the package can be utilized as a magnetometer. A package can also be operated to cycle between different uses.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A device configured to operate to operate as an atomic clock or as a magnetometer, the device comprising:
    power source contact pads;
    a vapor cell comprising an alkali metal vapor;
    a photodetector;
    a laser configured to excite an electron transition in the alkali metal vapor, the laser positioned to direct an optical signal through the vapor cell and towards the photodetector; and
    first, second and third sets of conductive coils coupled to the power source contact pads, the first, second and third sets of conductive coils configured to: when powered, magnetically isolate the vapor cell for the device to operate as the atomic clock; and when unpowered, magnetically unisolate the vapor cell for the device to operate as the magnetometer.

2. The device of claim 1, wherein the photodetector is a first photodetector, and the device further comprises a polarizing beam splitter and a second photodetector, the polarizing beam splitter positioned between the vapor cell and the first photodetector to receive the optical signal and to split the optical signal into: a first signal directed towards the first photodetector: and a second signal directed towards the second photodetector, the first signal being orthogonal to the second signal.

3. The device of claim 2 further comprising a reflector positioned to reflect the second signal from the polarizing beam splitter to the second photodetector.

4. The device of claim 1 further comprising an optics die positioned between the laser and the vapor cell, the optics die comprising at least one device selected from the group consisting of: a polarizer, a quarter wave plate, and a lens.

5. The device of claim 4 further comprising a heater configured to maintain the laser at a substantially constant temperature.

6. The device of claim 5 further comprising an encapsulation structure that encloses the vapor cell, the photodetector, the laser and the first, second and third sets of conductive coils.

7. A device configured to operate as an atomic clock or as a magnetometer, the device comprising:
- power source contact pads;
- a vapor cell comprising an alkali metal vapor;
- first and second photodetectors;
- a laser configured to excite an electron transition in the alkali metal vapor, the laser positioned to provide an optical signal directed through the vapor cell and towards the first photodetector;
- a polarizing beam splitter positioned between the vapor cell and the first photodetector to receive the optical signal and to split the optical signal into: a first signal directed toward the first photodetector: and a second signal directed toward the second photodetector, the first signal being orthogonal to the second signal; and
- first, second and third sets of conductive coils coupled to the power source contact pads, the first, second and third sets of conductive coils configured to: when powered, magnetically isolate the vapor cell in a first mode for the device to operate as the atomic clock; and when unpowered, magnetically unisolate the vapor cell in a second mode for the device to operate as the magnetometer.

8. The device of claim 7 further comprising a reflector positioned to reflect the second signal from the polarizing beam splitter to the second photodetector.

9. The device of claim 7 further comprising an optics die positioned between the laser and the vapor cell, the optics die comprising at least one device selected from the group consisting of: a polarizer, a quarter wave plate, and a lens.

10. The device of claim 9 further comprising a heater configured to maintain the laser at a substantially constant temperature.

11. The device of claim 7 further comprising an encapsulation structure that encloses the vapor cell, the first and second photodetectors, the laser, the polarizing beam splitter and the first, second and third sets of conductive coils.

* * * * *